United States Patent [19]

Backes et al.

[11] Patent Number: 4,618,788

[45] Date of Patent: Oct. 21, 1986

[54] INTEGRATED DELAY CIRCUIT FOR DIGITAL SIGNALS

[75] Inventors: Reiner Backes; Ulrich Langenkamp, both of Freiburg, Fed. Rep. of Germany

[73] Assignee: ITT Industries, Inc., New York, N.Y.

[21] Appl. No.: 580,512

[22] Filed: Feb. 15, 1984

[30] Foreign Application Priority Data

Feb. 17, 1983 [EP] European Pat. Off. ............ 83101491
Apr. 20, 1983 [EP] European Pat. Off. ............ 83103820

[51] Int. Cl.⁴ .......................... H03K 5/13; H03L 7/00
[52] U.S. Cl. .................................... 307/603; 307/594; 307/269; 307/602; 328/63

[58] Field of Search ............... 307/590, 594, 595, 597, 307/602, 603, 605, 269, 246; 328/14, 63; 358/17, 18; 364/824

Primary Examiner—Stanley D. Miller
Assistant Examiner—Timothy P. Callahan
Attorney, Agent, or Firm—Donald J. Lenkszus

[57] ABSTRACT

A delay circuit provides adjustable delay in constant increments. In order to achieve adjustable but constant delay times of a chain of inverter pairs, each pair is completed by a capacitor, a third inverter, and a transfer transistor the gate of which is fed by a voltage controlling the pair delay time. This voltage is generated by a control circuit measuring the actual delay time of the chain with respect to the period of a constant clock signal.

18 Claims, 7 Drawing Figures

INTEGRATED DELAY CIRCUIT FOR DIGITAL SIGNALS

BACKGROUND OF THE INVENTION

The present invention relates to an insulated-gate field-effect transistor integrated delay circuit for digital signals. More specifically the invention pertains to such a delay circuit whereby a delay adjustable in n equi-distant steps can be produced using 2n cascaded static inverters each consisting of a switching transistor and a load transistor. An odd-numbered inverter and the following even-numbered inverter form one of at least n stages giving the delay t and having their outputs coupled to the delay output via a 1-out-of-n selector switch. The delay is adjusted and regulated by a digital measuring arrangement with a counter followed by a digital-to-analog converter.

A delay circuit of this kind is disclosed in the published Patent Application EP No. 0 059 802 which corresponds to U.S. patent application No. 349,228, filed Feb. 16, 1982 and which issued as U.S. Pat. No. 4,489,342 on Dec. 18, 1982 and which assigned to the same assignee. In the arrangement shown there in FIG. 1, the stage delay, which otherwise varies because of manufacturing variations, is maintained constant by connecting an odd number of inverters to form a ring during delay intervals ("rest periods") and thus producing an oscillation from whose frequency a control signal is derived. The control signal controls the bias of the load transistors via the digital-to-analog converter in such a way that the stage delay is held constant.

With this arrangement, variations in stage delay due to manufacturing variations can be compensated for only to a limited extent because the pulling range is limited as a result of the influence exerted on the load transistors. The output voltage of the digital-to-analog converter influences the ON resistance of a load transistor via the gate of the latter, and the range of variation of this ON resistance is not sufficient for the intended purpose.

SUMMARY OF THE INVENTION

An object of the invention is to provide a delay circuit in which the pulling range is substantially extended so that the upper value of the pulling range is approximately equal to twice the lower value.

One advantage of the invention follows directly from the way in which the object is attained. Another advantage lies in the fact that no delay intervals are required during which the actual stage delay must be measured. In a circuit in accordance with the invention, stage-delay regulation takes place continuously, with the clock frequency serving as the reference frequency for the regulation.

In an embodiment of the invention it is possible not only to achieve an adjustable delay of a digital signal in a simple manner, but also to measure differences in phase between a digital signal and the clock frequency.

BRIEF DESCRIPTION OF THE DRAWINGS

The invention will now be explained in more detail with reference to the accompanying drawings, in which.

DETAILED DESCRIPTION

Figure 1:
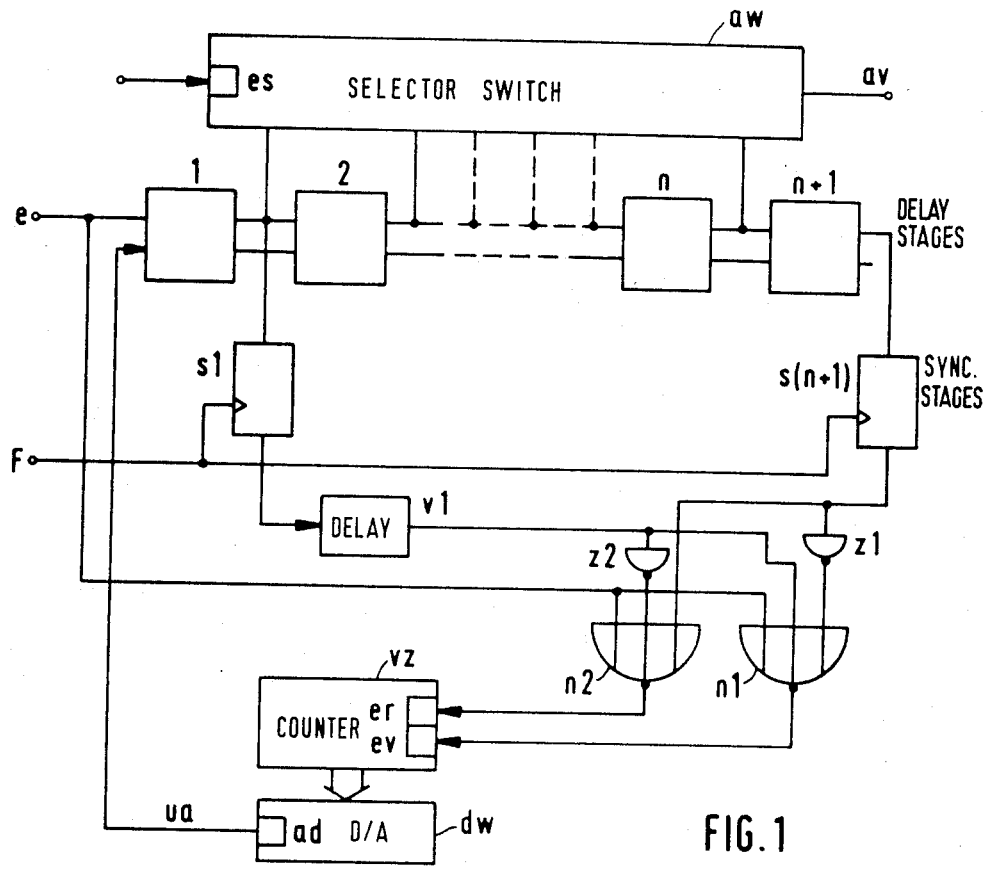
FIG. 1 shows an embodiment of the invention in block-diagram form.

The delay circuit of FIG. 1 includes cascade connected delay stages 1, 2 . . . n. Each delay stage is identical and provides a delay t. The input signal is applied to terminal e which in turn is connected to the input of the first delay stage 1. Each delay stage 1, 2 . . . n has its output connected to an input of selector switch aw. The selector switch aw is a 1 out of n selector which connects one of its n inputs to the output av in response to selection or control signals applied at the select input es of switch aw. Thus the amount of delay from input terminal e to output av is selectable in n equidistant steps by the selector switch in response to the select or control signals at input es.

The delay of each of the delay stages 1, 2 . . . n is adjustable and circuitry is provided for adjusting and regulating the delay of the stages. An additional adjustable delay stage n+1 is provided. The outputs of delay stage 1 and delay stage n+1 are synchronized with a clock signal F. An up-down counter v2 is controlled by signals derived from the synchronized outputs in conjunction with the input signal applied to terminal c. The output of the counter v2 is applied to a digital to analog converter dw which generates an analog voltage Ua which controls the delay time of each of the delay stages.

Figure 2A:
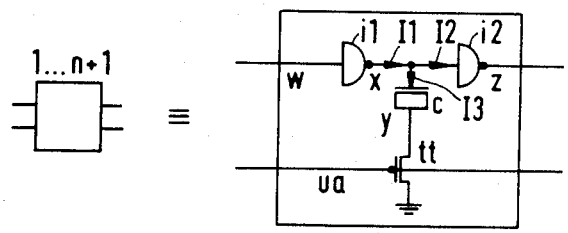
FIGS. 2a and 2b show two preferred embodiments of the delay stages of FIG. 1, which are indicated there only by blocks for simplicity.
Figure 2B:
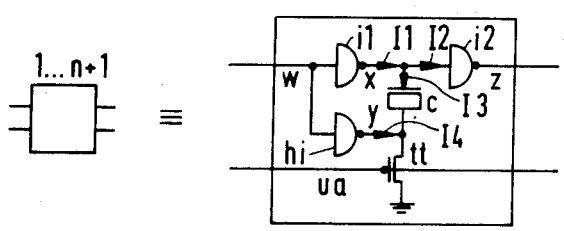

FIGS. 2a and 2b show the internal circuitry of two preferred delay stages. In FIG. 2a, the signal path of the stage contains the odd-numbered inverter i1, which is followed by the even-numbered inverter i2. Connected to the junction of the output of the inverter i1 and the input of the inverter i2 is one terminal of the capacitor c, whose other terminal is grounded through the channel of the transfer transistor tt. The gate of this transfer transistor is at the voltage ua, which adjusts the delay t. In FIG. 2b, the auxiliary inverter hi has been added. Its input is connected to the input of the stage, and its output is coupled to the output of the odd-numbered inverter i1 through the capacitor c.

The two inverters i1, i2 (FIG. 2a) and the three inverters i1, i2, hi (FIG. 2b) are static inverters each consisting of a switching transistor and a load transistor having their channels connected in series; the channel of the switching transistor is grounded, that of the load transistor is connected to a supply voltage.

The other subcircuits of FIG. 1, which will now be explained, serve to maintain a constant delay v. The output of the first stage 1 and that of the stage n+1 are connected to the inputs of the first clock-synchronizing stage s1 and the last clock-synchronizing stage s (n+1), respectively, whose clock inputs are presented with the clock signal F of frequency fc=1/nt where t is the delay provided by n cascaded delay stages.

For the clock-synchronizing stages, conventional stages can be used which synchronize the input signal with the clock signal in such a way that an output signal is provided only when the clock signal is at one of its two logic levels H, L. An example of such a clock-synchronizing stage is the arrangement disclosed in Auslegeschrift DE No. 26 57 281 B2, corresponding to British Pat. No. 1,557,508, where the clock signal F must then be in the form of a usual two-phase clock signal.

The first delay element v1 delays the output signal of first clock-synchronizing stage s1 by one period of the clock signal F. Its output is coupled to the first input of the first NOR gate n1. The output of the last clock-synchronizing stage s(n+1) is connected via the first additional inverter z1 to the second input of the first NOR gate n1, whose third input is connected to the input e of the delay circuit.

The output of the last clock-synchronizing stage s(n+1) is also coupled to the first input of the second NOR gate n2. The output of the first delay element v1 is connected via the second additional inverter z2, to the second input of the second NOR gate n2, whose third input is connected to the input e of the delay circuit. The output of the first NOR gate is coupled to the count up input ev of the up/down counter vz, while the output of the second NOR gate n2 is connected to the count down input er of this counter.

The outputs of the counter vz are connected to the parallel input of the digital-to-analog converter dw, whose analog output ad, which provides the voltage ua, is connected to the gates of the transfer transistors tt of the stages 1 ... n+1.

Figure 3A:
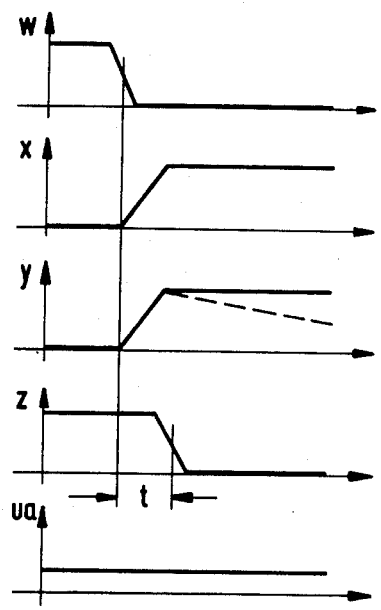
FIGS. 3a and 3b show timing diagrams illustrating the operation of a delay stage.
Figure 3B:
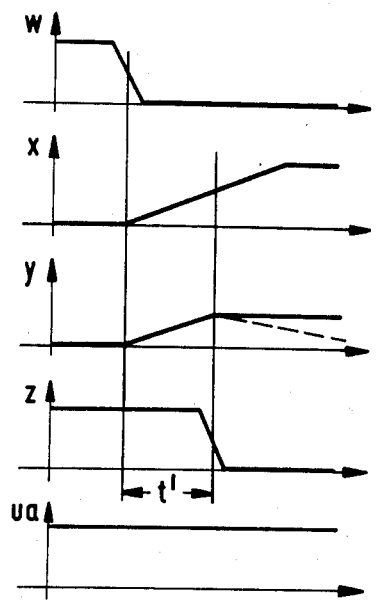

The control action of the voltage ua on the stage delay t is apparent from FIGS. 3a and 3b. In FIGS. 2a and 2b, arrows indicate the directions of (dynamic) transient currents I1, I2, I3, I4. The larger the current I2, the shorter the delay t produced by the stage. The current I1 is determined by the layout of the odd-numbered inverter i1. Since, according to Kirchhoff's current law, I2=I3−I1, the quantity determining the delay t for a given layout is the current I3. This current is dependent on the value of the capacitor c and the ON resistance of the transfer transistor tt: the higher the ON resistance, the smaller the current I3. The ON resistance, in turn, depends on the control voltage ua. As the control voltage ua increases, the ON resistance decreases; as a result, I2 decreases, too, so that the delay t increases.

FIGS. 3a and 3b show the curves of the potentials at the points w,x,y,z of FIGS. 2a and 2b, the potential at the point y being represented by the broken line in the case of FIG. 2b because the capacitor c discharges slowly.

If the additional inverter hi is used, as show in FIG. 2b, the transient current I4 is present which, at a low control voltage ua (=transfer transistor tt nearly cut off) and with a suitable layout of the auxiliary inverter hi, e.g., I4≧2I1, causes the current I3 to change its sign, and I2 to exceed I1. Thus, the delay mimimum becomes smaller than without the auxiliary inverter hi, which represents an additional advantage of this measure.

In FIG. 3a it is assumed that the tuning voltage ua is so small as not to turn the transfer transistor tt on. In FIG. 2b, the waveforms of the signals x and y at the outputs of the odd-numbered inverter i1 and the auxiliary inverter hi, respectively, are then identical, and the capacitor c has no effect. The delay results from the fact that the even-numbered inverter i2 does not begin to conduct until the output voltage x of the odd-numbered inverter i1 reaches the threshold voltage of the switching transistor of the even-numbered inverter i2. In the case considered in FIG. 3a, the shortest possible stage delay t is thus produced.

In the case of FIG. 3b, the output voltage ua of the digital-to-analog converter dw is greater than the threshold voltage of the transfer transistor tt, so that the latter is on. Only part of the shunt current of the auxiliary inverter hi is now available for reversing the charge of the node capacitance, because the other part flows through the transfer transistor tt. In addition, the output voltage y of the auxiliary inverter hi is clamped, i.e., it can no longer reach the maximum possible level. These two effects result in a potental difference across the capacitor c, so that the latter is effective. Therefore, the output voltage x of the odd-numbered inverter i1 rises in the same way as the output voltage y of the auxiliary inverter hi until this output voltage y is clamped. This rise, however, is flatter than in FIG. 3a. The output voltage x then rises only very slowly due to the action of the capacitor, so that the turn-on threshold of the even-numbered inverter i2 is only reached with a corresponding delay. This gives the delay t', which is longer than that shown in FIG. 3a.

Figure 4:
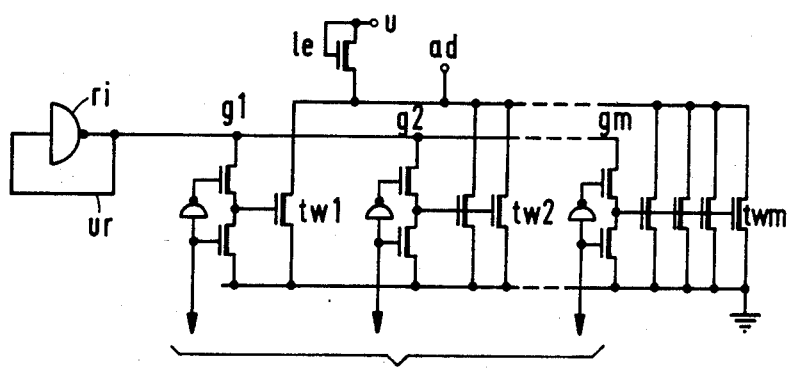
FIG. 4 is a schematic circuit diagram of an embodiment of a digital-to-analog converter as preferably used in the invention.

FIG. 4 is a schematic circuit diagram of a digital-to-analog converter as preferably used in the invention. For each output of the up/down counter vz, one converter transistor tw1, tw2, twm is provided which has its channel inserted between ground and the converter output ad, which is connected to the supply voltage u via the load device, which in FIG. 4 is a depletion-mode transistor. The converter transistors tw2 to twm are formed from several parallel-connected transistors which are identical in design to the converter transistor tw1. The number of parallel-connected transistors, starting with the first converter transistor tw1, increases in accordance with a power-of-two-series and with increasing significance of the count digits.

The gate of each converter transistor tw1 ... twm is connected to the output of the associated push-pull stage g1 ... gm, whose controlled current path is connected between ground and the reference voltage ur developed at the output of the reference inverter ri, which has its input connected to its output. The geometry, i.e., the layout, of the reference inverter ri is identical to that of the odd-numbered inverter i1 of each stage 1 ... n+1, and it has the same longitudinal dimension as these stages. This ensures that manufacturing variations affect the reference inverter ri and the odd-numbered inverters i1 in the same manner and, thus, cancel each other. The two transistors of the push-pull stages g1 ... gm are driven with the respective counter output signal in the usual manner. The gate of the grounded transistor is driven with this signal direct, and the gate of the transistor connected to the reference voltage ur is driven with this signal via an inverter.

Although the preferred digital-to-analog converter of FIG. 4 is very simple in design, its use together with the reference inverter ri as a reference-voltage source offers the advantage that the converter's range of maximum linearity always lies in the range of the turn-on threshold of the odd-numbered inverter i1, regardless of manufacturing variations. The considerable nonlinearity of this converter type is thus of practically no consequence. This simple converter type is thus adapted for use in conjuction with the stages 1 ... n+1. The consecutive number m and, consequently, the number of converter trasistors and stages are equal to the number of outputs of the up/down counter vz, whose digital signals are to be converted into analog form. Accordingly, the consecutive number m need not be identical with the number of stages, n.

Figure 5:
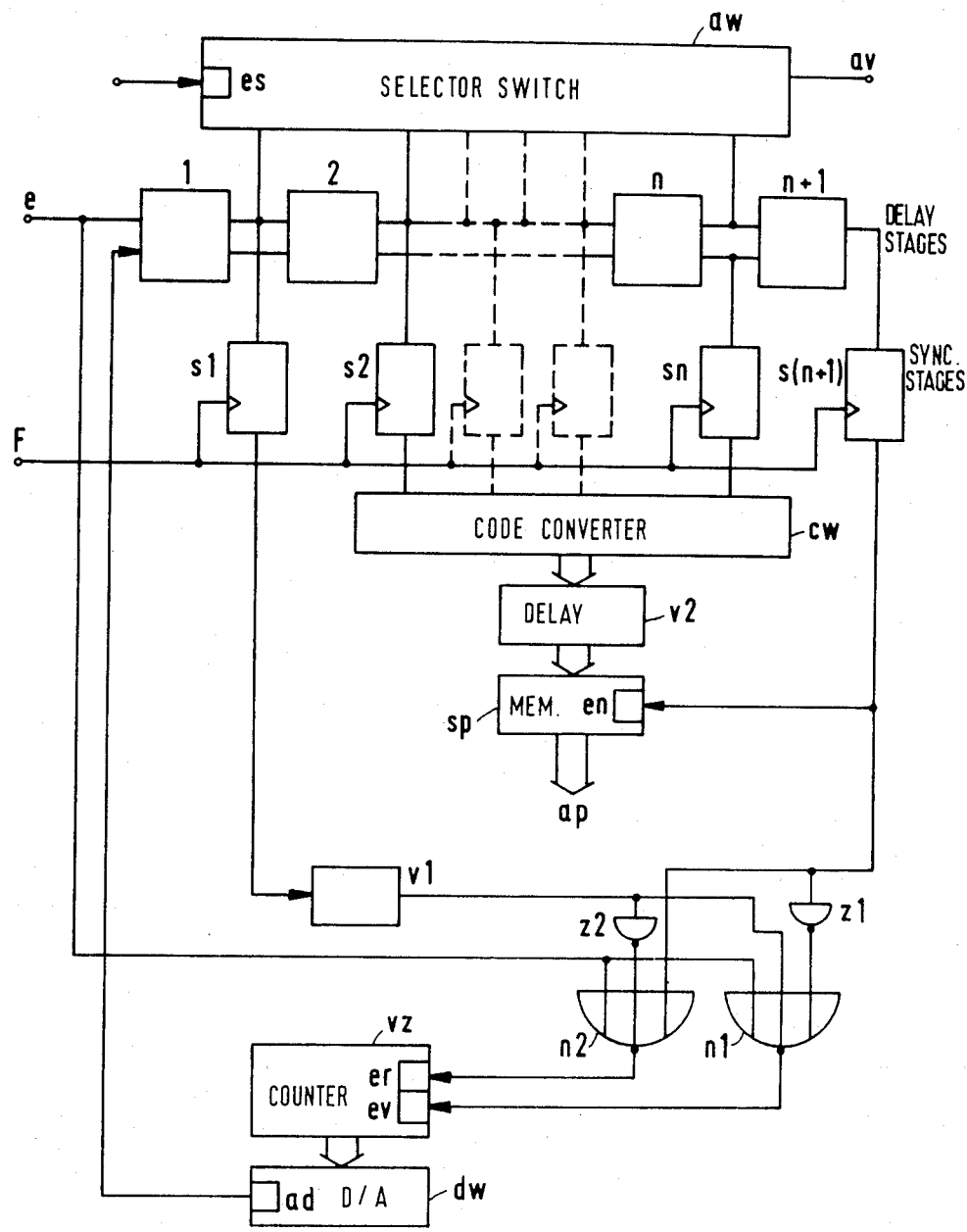
FIG. 5 is a block diagram of a preferred embodiment of the invention which is also suitable for use as a phase-measuring circuit.

FIG. 5 is a block diagram of the above-mentioned embodiment of the invention for also measuring the difference in phase between the input signal and the clock signal F.

The outputs of the second to nth stages 2 ... n are connected to additional clock-synchronizing stages s2 ... sn, respectively, whose clock inputs are fed with the clock signal F. The output of each stage 1 ... n+1 is thus coupled to a clock-synchronizing stage s1 ... s(n+1).

Connected to the output of the second to nth clock-synchronizing stages s2 ... sn is the parallel input of the code converter cw, which converts the thermometer code appearing at the outputs into the pure base-2 binary code. The therometer code corresponds to half of the well-known Johnson code used in so-called Johnson counters; see, for example, the book by D. Becker, H. Mader entitled, "Hochintegrierte MOS-Schaltungen", Stuttgart, 1972, pages 132 to 134, especially table 6.7.

The outputs of the code converter cw are coupled via a second delay element v2, which is clocked by the clock signal F and gives a delay equal to the period of the clock signal F, to the parallel input of the memory sp, whose enable input en is connected to the clock-synchronizing stage s(n+1), and whose output is the phase-difference output ap.

By means of the first and last clock-synchronizing stages s1 and s(n+1), see FIGS. 1 and 5, the actual delay provided by the delay states 1 ... n is measured in the invention, this measuring circuit containing n stages, because the first clock-synchronizing stage s1 is connected to the input of the stage 2. This is permissible because all stages are identical in design. On the other hand, this measurement is referred to the frequency of the clock signal F by means of the clock-synchronizing stages s1, s(n+1), so that the combination of the measurement results by means of the NOR gates n1, n2 and the up/down counter vz already provides the control signal.

With the phase-measuring circuit of FIG. 5, the phase of the input signal can be measured with respect to that of the clock signal F in steps of the delay t. If, for example, the frequency of the clock signal is four times the chrominance-subcarrier frequency in a color-television receiver, and n=16, the phase of the input signal can be measured in steps of 3.5 ns, and this signal can be delayed in steps of the same length. This application in color-television receivers occurs especially in those with digital signa-processing and -generating circuitry, e.g., in horizontal deflection circuits.

The invention can preferably be implemented with enhancement mode transistors, particularly of the n-channel type, for the switching transistors of all inverters and gates, in which case depletion-mode transistors will preferably be used for the load devices.

With a comparable number of stages, the arrangement in accordance with the invention occupies about 70 percent less chip area than the prior art arrangement and dissipates only about 40 percent of the power dissipated in that arrangement.

What is claimed is:

1. An integrated delay circuit for digital signals said circuit providing a delay adjustable in n equal steps comprising:
    an input terminal for receiving said digital signals;
    an output terminal;
    n+1 cascaded delay stages coupled at one end of said input terminal, each of said delay stages comprising a control terminal, first and second cascaded inverters, an integrated capacitor having one terminal coupled to the output of said first inverter, a transfer transistor having a gate coupled to a control terminal and via its channel coupling the other terminal of said capacitor to ground, the delay time of said delay stage being adjusted by the potential at said control terminal;
    a one-out-of-n selector switch for selecting the delay between said input and said output terminal and having n inputs coupled respectively to the outputs of n of said delay stages and having an output coupled to said output terminal;
    a clock terminal receiving clock signals having a frequency fc where fc=1/nt and t is the delay provided by n of said n+1 cascaded delay stages;
    a first clock synchronizing stage having a first input coupled to said clock terminal, a second input coupled to the output of a first delay stage of said n+1 cascaded delay stages, a first synchronizing output, and providing signals from the output of said first delay stage synchronized to said clock signals at said first synchronized output;
    a second clock synchronizing stage having a first input coupled to said clock terminal, a second input coupled to the output of the last delay stage of said n+1 cascaded delay stages, a second synchronizing output, and providing signals from the output of said last delay stage synchronized to said clock signals at said second synchronizing output;
    a delay circuit having an input coupled said first synchronizing output for delaying the output thereof by one period of said clock signals;
    first and second combinational logic circuits each coupled to the output of said delay circuit, said second synchronizing output, and said input terminal for providing first and second control signals;
    an up/down count having an up input responsive to said first control signal and a down input responsive to said second control signal, and a plurality of count output terminals;
    a digital to analog converter having a plurality of input terminals each coupled to one of said plurality of count output terminals and having an analog output terminal coupled to said control terminal of all of said n+1 cascaded stages.

2. A delay circuit in accordance with claim 1, wherein each of said stages further comprises a third inverter having the input coupled to the input of said first inverter and its output coupled to said capacitor other terminal.

3. A delay circuit in accordance with claim 1 for use as a phase-measuring circuit to measure the difference in phase between said digital signals and said clock signals further comprising:
    n−2 clock synchronizing stages each connected to the output of one of the second through nth ones of said n+1 delay stages for synchronizing the ouput of the corresponding delay stage to said clock signals, the outputs of said n−2 stages collectively providing a thermometer code output;
    a code converter couple to the outputs of said n−2 clock synchronizng stages for converting said thermometer code output to a pure base-2 binary code output; a second delay circuit for delaying said binary code output by a delay equal to the period of said clock signals; and a memory having parallel inputs for receiving the delayed binary code output, an enable input connected to the output of said second clock synchronizing stage, and output terminals providing a phase difference output.

4. A delay circuit in accordance with claim 1, wherein said first and second inverters each comprise n-channel depletion mode inverters.

5. A delay circuit in accordance with claim 2, wherein said first, second and third inverters each comprising n-channel depletion mode inverters.

6. A delay circuit in accordance with claim 3, wherein said first and second inverters each comprise n-channel depletion mode inverters.

7. A delay circuit in accordance with claim 1, wherein said digital to analog converter comprises:

a plurality of converter transistor groups, each group being associated with a corresponding one of said digital to analog input terminals, each of said converter transistors having its channel coupled between said analog output terminal and ground;

a load device coupling said output terminal to a supply voltage terminal;

each of said converter transistor groups comprising one or more parallel connected transistors, the number of which beginning with the first group of said plurality of converter transistor groups corresponds to a power of two series;

a plurality of converter stages each having transistors connected in a push-pull arrangement the gate of each converter transistor being connected to the output of an associated one of said plurality of converter stages, each of said plurality of converter stages having a controlled current path of its push-pull transistor arrangement connected between ground and a reference voltage, said reference voltage being provided by a reference inverter having its input connected to its output, the layer of said reference inverter being identical to and having the same longitudinal dimension as each said first inverter.

8. A delay circuit in accordance with claim 2, wherein said digital to analog converter comprises:

a plurality of converter transistor groups, each group being associated with a corresponding one of said digital to analogy input terminals, each of said converter transistors having its channel coupled between said analog output terminal and ground;

a load device coupling said output terminal to a supply voltage terminal;

each of said converter transistor groups comprising one or more parallel connected transistors, the number of which beginning with the first group of said converter transistors corresponds to a power of two series;

a plurality of converter stages each having transistors connected in a push-pull arrangement the gate of each converter transistor being connected to the output of an associated one of said plurality of converter stages, each of said plurality of converter stages having a controlled current path of its push-pull transistor arrangement connected between ground and a reference voltage, said reference voltage being provided by a reference inverter having its input connected to its output, the layout of said reference inverter being identical to and having the same longitudinal dimension as each said first inverter.

9. A delay circuit in accordance with claim 3, wherein said digital to analog converter comprises:

a plurality of converter transistor groups, each group being associated with a corresponding one of said digital to analog input terminals, each of said converter transistors having its channel coupled between said analog output terminal and ground;

a load device coupling said output terminal to a supply voltage terminal;

each of said converter transistor groups comprising one or more parallel connected transistors, the number of which beginning with the first group of said converter transistors corresponds to a power of two series;

a plurality of converter stages each having transistors connected in a push-pull arrangement the gate of each converter transistor being connected to the output of an associated one of said plurality of converter stages, each of said plurality of converter stages having a controlled current path of its push-pull transistor arrangement connected between ground and a reference voltage, said reference voltage being provided by a reference inverter having its input connected to its output, the layout of said reference inverter being identical to and having the same longitudinal dimension as each said first inverter.

10. A delay circuit in accordance with claim 4, wherein said digital to analog converter comprises:

a plurality of converter transistor groups, each group being associated with a corresponding one of said digital to analog input terminals, each of said converter transistors having its channel coupled between said analog output terminal and ground;

a load device coupling said output terminal to a supply voltage terminal;

each of said converter transistor groups comprising one or more parallel connected transistors, the number of which beginning with the first group of said converter transistors corresponds to a power of two series;

a plurality of converter stages each having transistors connected in a push-pull arrangement the gate of each converter transistor being connected to the output of an associated one of said plurality of converter stages, each of said plurality of converter stages having a controlled current path of its push-pull transistor arrangement connected between ground and a reference voltage, said reference voltage being provided by a reference inverter having its input connected to its output, the layout of said reference inverter being identical to and having the same longitudnal dimension as each said first inverter.

11. A delay circuit in accordance with claim 5, wherein said digital to analog converter comprises:

a plurality of converter transistor groups, each group being associated with a corresponding one of said digital to analog input terminals, each of said converter transistors having its channel coupled between said analog output terminal and ground;

a load device coupling said output terminal to a supply voltage terminal;

each of said converter transistor groups comprising one or more parallel connected transistors, the number of which beginning with the first group of said converter transistors corresponds to a power of two series;

a plurality of converter stages each having transistors connected in a push-pull arrangement the gate of each converter transistor being connected to the output of an associated one of said plurality of converter stages; each of said plurality of converter stages having a controlled current path of its push-pull transistor arrangement connected between ground and a reference voltage, said reference voltage being provided by a reference inverter having its input connected to its output, the layout of said reference inverter being identical to and having the same longitudinal dimension as each said first inverter.

12. A delay circuit in accordance with claim 6, wherein said digital to analog converter comprises:

a plurality of converter transistor groups, each group being associated with a corresponding one of said digital to analog input terminals, each of said converter transistors having its channel coupled between said analog output terminal and ground;

a load device coupling said output terminal to a supply voltage terminal;

each of said converter transistor groups comprising one or more parallel connected transistors, the number of which beginning with the first group of said converter transistor corresponds to a power of two series;

a plurality of converter stages each having transistors connected in a push-pull arrangement the gate of each converter transistor being connected to the output of an associated one of said plurality of converter stages, each of said plurality of converter stages having a controlled current path of its push-pull transistor arrangement connected between ground and a reference voltage, said reference voltage being provided by a reference inverter having its input connected to its output, the layout of said reference inverter being identical to and having the same longitudinal dimension as each said first inverter.

13. A delay circuit in accordance with claim 1, wherein said first combinational logic circuit comprises: a NOR gate having a first input coupled to said input, a second input coupled to the output of said delay circuit, and a third input, and an inverter coupling the output of said another clock synchronizing stage output to said third input; and wherein said second combinational logic circuit comprises: a NOR gate having a first input coupled to said input, a second input coupled to the output of said another clock synchronizing stage output, and a third input; and an inverter coupling the output of said delay circuit to said third input.

14. A delay circuit in accordance with claim 2, wherein said first combinational logic circuit comprises: a NOR gate having a first input coupled to said input, a second input coupled to the output of said delay circuit, and a third input, and an inverter coupling the output of said another clock synchronizing stage output to said third input; and wherein said second combinational logic circuit comprises: a NOR gate having a first input coupled to said input, a second input coupled to the output of said another clock synchronizing stage output, and a third input; and an inverter coupling the output of said delay circuit to said third input.

15. A delay circuit in accordance with claim 3, wherein said first combinational logic circuit comprises: a NOR gate having a first input coupled to said input, a second input coupled to the output of said delay circuit, and a third input, and an inverter coupling the output of said another clock synchronizing stage output to said third input; and wherein said second combinational logic circuit comprises: a NOR gate having a first input coupled to said input, a second input coupled to the output of said another clock synchronizing stage output, and a third input; and an inverter coupling the output of said delay circuit to said third input.

16. A delay circuit in accordance with claim 7, wherein said first combinational logic circuit comprises: a NOR gate having a first input coupled to said input, a second input coupled to the output of said delay circuit, and a third input, and an inverter coupling the output of said another clock synchronizing stage output to said third input; and wherein said second combinational logic circit comprises: a NOR gate having a first input coupled to said input, a second input coupled to the output of said another clock synchronizing stage output, and a third input; and an inverter coupling the output of said delay circuit to said third input.

17. A delay circuit in accordance with claim 8, wherein said first combinational logic circuit comprises: a NOR gate having a first input coupled to said input, a second input coupled to the output of said delay circuit, and a third input, and an inverter coupling the output of said another clock synchronizing stage output of said third input; and wherein said second combinational logic circuit comprises: a NOR gate having a first input coupled to said input, a second input coupled to the output of said another clock synchronizing stage output, and a third input; and an inverter coupling the output of said delay circuit to said third input.

18. A delay circuit in accordance with claim 9, wherein said first combinational logic circuit comprises: a NOR gate having a first input coupled to said input, a second input coupled to the output of said delay circuit, and a third input, and an inverter coupling the output of said another clock synchronizing stage output to said third input; and wherein said second combinational logic circuit comprises: a NOR gate having a first input coupled to said input, a second input coupled to the output of said another clock sychronizing stage output, and a third input; and an inverter coupling the output of said delay circuit to said third input.

* * * * *